(12) United States Patent
Scharf et al.

(10) Patent No.: US 10,777,491 B2
(45) Date of Patent: Sep. 15, 2020

(54) PACKAGE COMPRISING CARRIER WITH CHIP AND COMPONENT MOUNTED VIA OPENING

(71) Applicant: Infineon Technologies AG, Neubiberg (DE)

(72) Inventors: Thorsten Scharf, Regensburg (DE); Thorsten Meyer, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/280,181

(22) Filed: Feb. 20, 2019

(65) Prior Publication Data

US 2019/0259688 A1 Aug. 22, 2019

(30) Foreign Application Priority Data

Feb. 22, 2018 (DE) .................. 10 2018 103 979

(51) Int. Cl.
*H01L 23/40* (2006.01)
*H01L 23/495* (2006.01)
(Continued)

(52) U.S. Cl.
CPC .... *H01L 23/49555* (2013.01); *H01L 21/4842* (2013.01); *H01L 21/563* (2013.01); *H01L 23/3107* (2013.01); *H01L 23/3121* (2013.01); *H01L 23/3135* (2013.01); *H01L 23/3171* (2013.01); *H01L 24/09* (2013.01); *H01L 24/16* (2013.01); *H01L 24/17* (2013.01); *H01L 24/49* (2013.01); *H01L 24/81* (2013.01); *H01L 25/105* (2013.01); *H01L 24/13* (2013.01); *H01L 24/45* (2013.01); *H01L 24/48* (2013.01); *H01L 2224/13101* (2013.01); *H01L 2224/13147* (2013.01); *H01L 2224/16245* (2013.01); *H01L 2224/45014* (2013.01); *H01L 2224/45015* (2013.01); *H01L 2224/45124* (2013.01); *H01L 2224/45147* (2013.01); *H01L 2224/48091* (2013.01); *H01L 2224/48247* (2013.01);
(Continued)

(58) Field of Classification Search
CPC . H01L 23/4012; H01L 23/495; H01L 23/498; H01L 23/49861; H01L 25/0657; H01L 25/0756; H01L 25/117; H01L 2224/12105; H01L 2224/28105
See application file for complete search history.

(56) References Cited

U.S. PATENT DOCUMENTS

| | | |
|---|---|---|
| 5,744,827 A | 4/1998 | Jeong et al. |
| 6,489,687 B1 | 12/2002 | Hashimoto |

(Continued)

FOREIGN PATENT DOCUMENTS

| | | |
|---|---|---|
| DE | 10 2009 044 712 | 7/2010 |
| DE | 10 2015 116 081 | 3/2017 |

(Continued)

*Primary Examiner* — Hoai V Pham
(74) *Attorney, Agent, or Firm* — Dicke, Billig & Czaja, PLLC

(57) ABSTRACT

A package comprising a carrier, at least one electronic chip mounted on one side of the carrier, an encapsulant at least partially encapsulating the at least one electronic chip and partially encapsulating the carrier, and at least one component attached to an opposing other side of the carrier via at least one contact opening.

22 Claims, 4 Drawing Sheets

(51) Int. Cl.
*H01L 23/31* (2006.01)
*H01L 21/48* (2006.01)
*H01L 23/00* (2006.01)
*H01L 21/56* (2006.01)
*H01L 25/10* (2006.01)

(52) U.S. Cl.
CPC ............ *H01L 2224/73253* (2013.01); *H01L 2224/81385* (2013.01); *H01L 2224/81801* (2013.01); *H01L 2924/181* (2013.01); *H01L 2924/1815* (2013.01); *H01L 2924/18161* (2013.01)

(56) References Cited

U.S. PATENT DOCUMENTS

| | | |
|---|---|---|
| 8,269,330 B1 | 9/2012 | Lee et al. |
| 9,716,068 B2 | 7/2017 | Meyer |
| 10,155,657 B2 | 12/2018 | Steiert et al. |
| 2007/0254409 A1* | 11/2007 | Yip ...................... H01L 25/105 438/126 |
| 2009/0152714 A1 | 6/2009 | Yamagishi et al. |
| 2016/0079146 A1 | 3/2016 | Kasemset et al. |
| 2017/0213781 A1 | 7/2017 | Lee et al. |

FOREIGN PATENT DOCUMENTS

| | | |
|---|---|---|
| EP | 2 330 621 | 6/2011 |
| JP | H07-249736 | 9/1995 |

\* cited by examiner

PACKAGE COMPRISING CARRIER WITH CHIP AND COMPONENT MOUNTED VIA OPENING

CROSS-REFERENCE TO RELATED APPLICATION

This Utility Patent Application claims priority to German Patent Application No. 10 2018 103 979.4, filed Feb. 22, 2018, which is incorporated herein by reference.

BACKGROUND OF THE INVENTION

Field of the Invention

The present invention relates to packages, an electronic apparatus, methods of manufacturing a package, a method of use, and a device.

Description of the Related Art

Packages may be denoted as encapsulated electronic chips with electrical connects extending out of the encapsulant and being mounted to an electronic periphery, for instance on a printed circuit board.

Packaging cost is an important driver for the industry. Related with this are performance, dimensions and reliability. The different packaging solutions are manifold and have to address the needs of the application. There are applications, where high performance is required, others, where reliability is the top priority—but all require lowest possible cost.

There is a need to manufacture a package with high level of functionality in a simple and reliable manner. For these and other reasons, there is a need for the present invention.

SUMMARY

According to an exemplary embodiment, a package is provided which comprises a carrier, at least one electronic chip mounted on one side of the carrier, an encapsulant at least partially encapsulating the at least one electronic chip and partially encapsulating the carrier, and at least one component attached to an opposing other side of the carrier via at least one contact opening.

According to another exemplary embodiment, a package is provided which comprises a carrier, an electronic chip mounted on the carrier, an encapsulant at least partially encapsulating the electronic chip and partially encapsulating the carrier, and a component attached to the carrier so as to establish an electrically conductive connection between the electronic chip and the component via at least one contact opening in the encapsulant.

According to another exemplary embodiment, an electronic apparatus is provided which comprises a mounting base (in particular a printed circuit board, PCB), and a package having the above-mentioned features mounted on the mounting base.

According to yet another exemplary embodiment, a method of manufacturing a package is provided, wherein the method comprises mounting at least one electronic chip on one side of a carrier, at least partially encapsulating the at least one electronic chip and partially encapsulating the carrier by an encapsulant, and thereafter attaching at least one component to an opposing other side of the carrier through an opening.

According to yet another exemplary embodiment, a method of manufacturing a package is provided, wherein the method comprises mounting an electronic chip on a carrier, at least partially encapsulating the electronic chip and partially encapsulating the carrier by an encapsulant, and, after that, attaching a component to the carrier through an opening so as to establish an electrically conductive connection between the electronic chip and the component.

According to yet another exemplary embodiment, a package having the above-mentioned features is used for a DC-DC converter (in particular with integrated driver and/or controller). For instance, such a DC-DC converter may be used for a micro-point-of-load application.

According to still another exemplary embodiment, a device for connection with a further device for forming a package is provided, wherein the device comprises a carrier, at least one electronic chip mounted on one side of the carrier, an encapsulant at least partially encapsulating the at least one electronic chip and partially encapsulating the carrier, and at least one contact opening configured for electrically connecting at least one component of the further device to an opposing other side of the carrier.

According to an exemplary embodiment of the invention, a packaging architecture is provided which an electronic chip (such as a semiconductor die) is mounted on (in particular is soldered to) a first surface of a carrier (such as a leadframe) to form a first sub-assembly. The first sub-assembly is encapsulated (for example molded) such that one, two or more contact openings are formed at a second surface of the carrier. After this encapsulation, a component or a second sub-assembly comprising such a component may be mounted at the one or more contact openings. By using one or more contact openings surrounding the at least one electronic chip for attaching at least one component, a high simplicity of assembling and a high reliability of the package may be achieved. At the same time, the fact that the at least one electronic chip is already encapsulated at the point of time of attaching the at least one component, a proper positional accuracy is obtained since the at least one electronic chip is already fixed in place within the encapsulant at a defined position. Further advantageously, the described manufacturing architecture is very simple and quick and allows obtaining a compact package with integrated component functionality. In an embodiment, a semiconductor package is provided on which another component is assembled (preferably by soldering) through one or more openings, recesses or through holes extending in particular through the encapsulant. Assembling the (preferably, but not necessarily, also and separately encapsulated) component (for instance a passive component such as an inductor) on top of the device of carrier, chip and encapsulant for example in a Surface Mounted Device (SMD) fashion has turned out as an electrically very efficient architecture which at the same time ensures a space-saving design. By the above-described measures, in particular a DC-DC converter preferably configured as micro-point-of-load application may be manufactured with low effort.

BRIEF DESCRIPTION OF THE DRAWINGS

The accompanying drawings, which are included to provide a further understanding of exemplary embodiments of the invention and constitute a part of the specification, illustrate exemplary embodiments of the invention.

In the drawings.

DETAILED DESCRIPTION OF EXEMPLARY EMBODIMENTS

Figure 1:
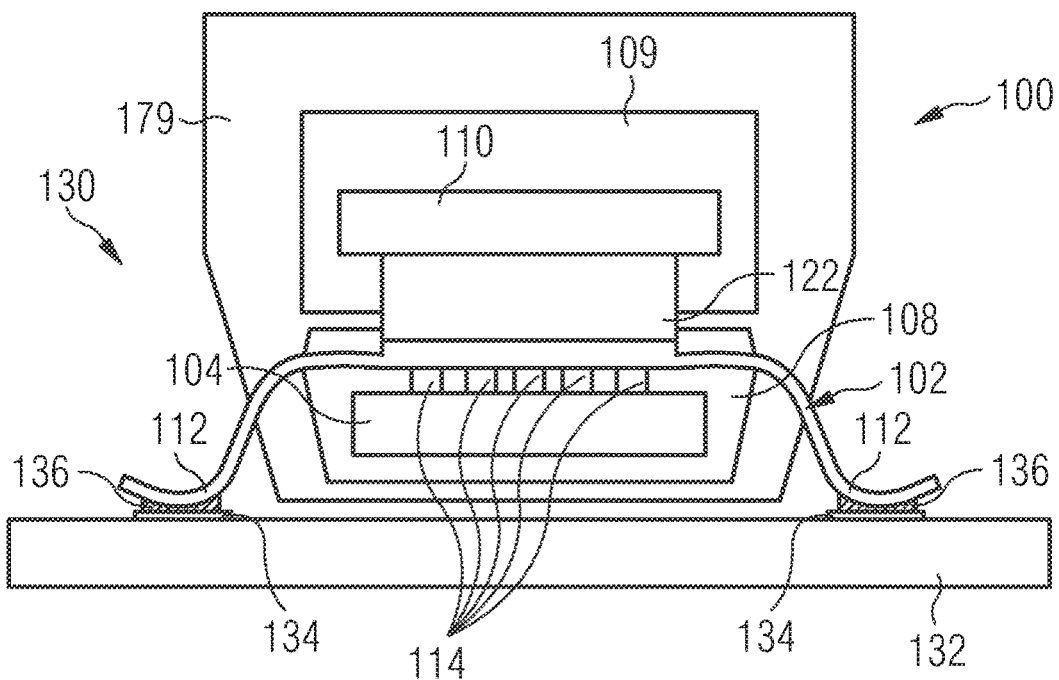
FIG. 1 illustrates a cross-sectional view of an electronic apparatus with a leaded package according to an exemplary embodiment.

In the following, further exemplary embodiments of the packages, the electronic apparatus, the device, and the methods will be explained.

In the context of the present application, the term "package" may particularly denote at least one at least partially encapsulated electronic chip with at least one external electric contact.

The term "electronic chip" may particularly denote a semiconductor chip having at least one integrated circuit element (such as a diode or a transistor) in a surface portion thereof. The electronic chip may be a naked die or may be already packaged or encapsulated.

In the context of the present application, the term "encapsulant" may particularly denote a substantially electrically insulating and preferably thermally conductive material surrounding (for example hermetically surrounding) an electronic chip and part of a carrier to provide mechanical protection, electrical insulation, and optionally a contribution to heat removal during operation. Such an encapsulant can be, for example, a mold compound.

In the context of the present application, the term "carrier" may particularly denote an electrically conductive structure which serves as a support for the one or more chips, and which may also contribute to the electric interconnection between the chip(s) and the one or more components. In other words, the carrier may fulfil a mechanical support function and an electric connection function.

In the context of the present application, the term "component" may particularly denote any electronic member which can be connected to a carrier to provide its electronic function to the package. In particular, the component may be a passive component such as an inductor (in particular a coil), a capacitor (such as a ceramic capacitor), an ohmic resistance, an inductance, a diode, a transformer, etc. In particular components being not capable of controlling current by another electrical signal may be denoted as passive components. However, the component may also be an active component, in particular may be a component being capable of controlling current by another electrical signal. Active components may be an analog electronic filter with the ability to amplify a signal or produce a power gain, an oscillator, a transistor or another integrated circuit element. In particular, the component may be any Surface Mounted Device (SMD), may be a sensor, a light-emitting diode or a laser diode. In another embodiment, the component is a package as well, in particular an encapsulated further electronic chip.

In the context of the present application, the term "micro-point-of-load" (or micro-POL, μPOL) may particularly denote a power supply (such as a voltage supply or a current source) for minor loads. For instance, it may denote a power supply solving the challenge of high peak current demands and low noise margins, required by high-performance semiconductors (such as microcontrollers or ASICs) by placing individual power supply regulators (for example linear or DC-DC) close to their point of use.

In an embodiment, the package is configured as micro-point-of-load package. For example, such a micro-point-of-load application may be configured as a DC/DC voltage converter (in particular realized by a half bridge). Such a micro-point-of-load application can be operated with a low load (for instance for operating a Wi-Fi module in a computer) and with relatively low current values (for instance in a range between 1 A and 10 A). A micro-point-of-load application may therefore have significantly lower current requirements than needed for a processor or corresponding applications (requiring for instance a current of 100 A).

In an embodiment, the at least one contact opening may be formed in the encapsulant and may be configured as a through hole through an encapsulant portion extending from its exterior surface up to the carrier and being laterally surrounded by encapsulant material. Such one or more contact openings may be formed in a portion of the encapsulant opposing or facing away from another portion of the encapsulant in which the at least one electronic chip is encapsulated.

In an embodiment, the carrier is a metallic carrier, in particular a leadframe. In the context of the present application, the term "leadframe" may particularly denote a preferred example of a carrier being configured as a sheet-like metallic structure which can be punched or patterned so as to form leadframe sections for mounting the chip(s), and connection leads as pin sections for electric connection of the package to an electronic environment when the chips are mounted on the leadframe. In an embodiment, the leadframe may be a metal plate (in particular made of copper) which may be patterned, for instance by stamping or etching. Forming the carrier as a leadframe is a cost-efficient and mechanically as well as electrically highly advantageous configuration in which a low ohmic connection of the chip(s) and the component(s) can be combined with a robust support capability of the leadframe. Furthermore, a leadframe may contribute to the thermal conductivity of the package and may remove heat generated during operation of the chip(s) and the component(s) as a result of the high thermal conductivity of the metallic (in particular copper) material of the leadframe. A leadframe or any other metallic carrier may be preferred due to its simplicity.

In an embodiment, the at least one electronic chip comprises at least one of the group consisting of a controller circuit, a driver circuit, and a power semiconductor circuit. All these circuits may be integrated into one semiconductor chip, or separately in different chips. For instance, a corresponding power semiconductor application may be realized by the chip(s), wherein integrated circuit elements of such a power semiconductor chip may comprise at least one transistor (in particular a MOSFET, metal oxide semiconductor field effect transistor), at least one diode, etc. In particular, circuits fulfilling a half-bridge function, a full-bridge function, etc., may be manufactured.

In an embodiment, the at least one component is at least partially embedded by a separate encapsulant (i.e. a further encapsulant which may be physically different from the encapsulant of the chip and the carrier). In other words, two separate encapsulants may be provided in the package, and two separate encapsulation procedures may be carried out. For example, it is possible to encapsulate the at least one electronic chip together with a portion of the carrier by a first encapsulant (for instance a first mold compound). Additionally, it is possible to encapsulate a part of the at least one component prior to attaching the latter to the encapsulated electronic chip.

In embodiment, the package comprises a common or an overall encapsulant at least partially encapsulating the carrier, the at least one electronic chip, the encapsulant and the at least one component. Hence, it is also possible to encapsulate (in particular by a further molding procedure, more particularly an overmolding procedure) the assembled sub-assemblies of carrier, chip and encapsulant on the one hand and component and further encapsulant on the other hand by yet another encapsulant as a robust shell for mechanically protecting all constituents of the package.

In an embodiment, any of the encapsulant of the at least one electronic chip and the carrier and/or the separate encapsulant of the at least one component and/or the overall encapsulant comprises a mold compound. Hence, the respective encapsulant may comprise a mold, in particular a plastic mold. For instance, a correspondingly encapsulated body (in particular chip with carrier, component) may be provided by placing the body or bodies between an upper mold tool and a lower mold tool and to inject liquid mold material therein. After solidification of the mold material, formation of the encapsulant is completed. If desired, the mold may be filled with particles improving its properties, for instance its heat removal properties.

Figure 5:
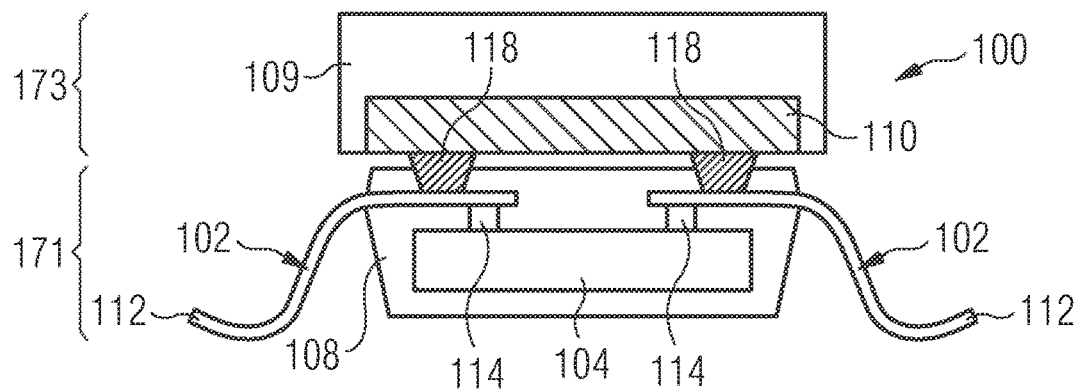
Figure 9:
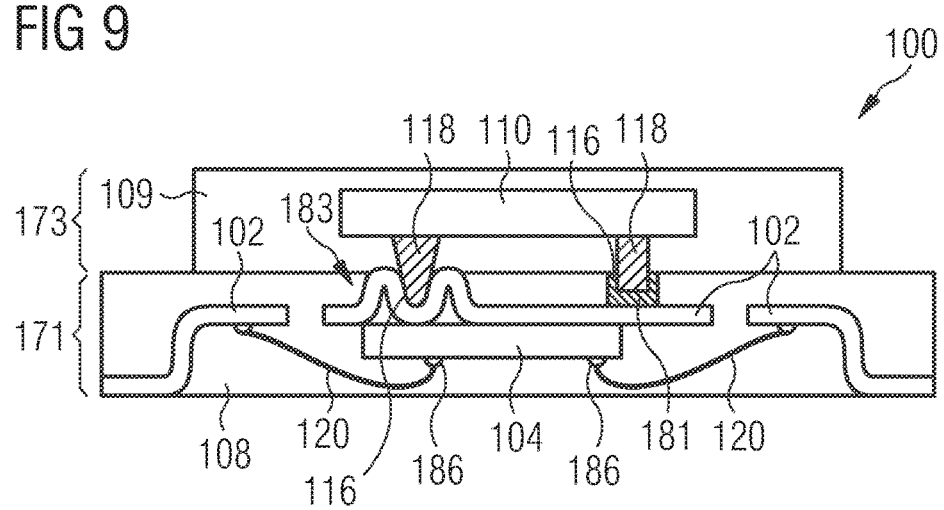
FIG. 9 illustrates a cross-sectional view of a leadless package according to an exemplary embodiment.
Figure 10:
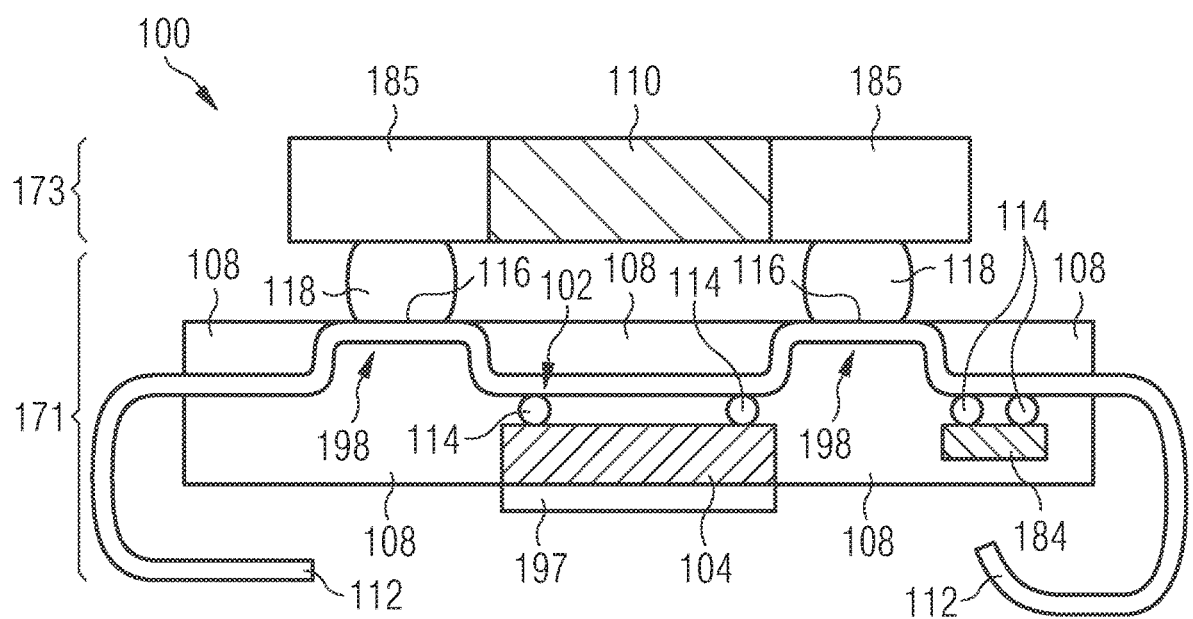
FIG. 10 illustrates a cross-sectional view of a leaded package according to an exemplary embodiment.

In one embodiment, at least one of the at least one contact opening is formed as contact opening in the encapsulant (see for instance FIG. 5 and FIG. 10). Additionally or alternatively, at least one of the at least one contact opening may be defined by a curved portion of the carrier (see for instance FIG. 9, left-hand side). Additionally or alternatively, at least one of the at least one contact opening may be defined by a plated structure (see for instance FIG. 9, right-hand side). Thus, in certain embodiments, the one or more contact openings on which the component may be attached may be indentations, in particular in the encapsulant. They may however also be embodied as bent portions of a leadframe or other carrier and/or by plating. Thus, at least one of the contact openings may also be planar or even raised.

In an embodiment, the at least one electronic chip comprises at least one electrically conductive connection element connected to the carrier. For instance, the at least one electrically conductive connection element comprises at least one of the group consisting of at least one pillar (in particular at least one copper pillar), a solder bump or a solder ball. It is particularly preferred to implement a number of (preferably copper) pillars, i.e. electrically conductive (for instance cylindrical) structures or posts, for establishing an electrically conductive connection between chip(s) and carrier. With such pillars it is possible to obtain sufficiently large distances between electronic chip and carrier to avoid undesired electric coupling paths. In particular, at least one electronic chip preferably provided with one or more pillars may be mounted (preferably soldered) into an encapsulated (in particular a molded) package sub-assembly underneath a carrier (in particular a chip carrier such as a leadframe), and a component may be mounted (for instance soldered) on top of this package sub-assembly to complete formation of the package. Such pillars may be column-like or post-like structures which may for instance be formed by plating on the electronic chip. For instance, such pillars may have an aspect ratio (i.e. a ratio between length and diameter) of at least 0.2, in particular of at least 0.5, more particularly of at least 1. Pillars, which have a sufficiently high aspect ratio, are advantageous for the described purpose, since they are capable of holding and electrically contacting a below arranged chip without the risk that undesired electric paths are formed.

In an embodiment, at least one main surface (in particular a lower main surface facing away from the component) of the at least one electronic chip is exposed with regard to the encapsulant. In other words, the at least one electronic chip may be only partially covered with the encapsulant so that at least a surface portion of the electronic chip remains uncovered from encapsulant material. In particular, it may be possible to expose a metal pad of the at least one electronic chip, a semiconductor surface of the at least one electronic chip/or and a heat sink attached to the at least one electronic chip. Allowing the at least one electronic chip to extend out of the encapsulant promotes and simplifies heat removal, which is of utmost importance for power semiconductor applications. As a heat sink, it is for instance possible to attach a metallic plate (for instance made of copper or aluminum) with high thermal conductivity to a main surface of the electronic chip being uncovered by encapsulant material and being exposed to an environment of the package, so that heat generated by the at least one electronic chip during operation of the package can be removed or dissipated from the package via the heat sink.

In an embodiment, the package comprises at least one bond wire electrically connecting the at least one electronic chip with the carrier. A bond wire may have the shape of a round filament or the shape of a flat ribbon, so that the bond wire may also be configured as a bond ribbon. Establishing a connection by one or more bond wires is a simple procedure which may implement bond wires made of copper and/or aluminum.

As a further alternative to such a connection by one or more bond wires, it is also possible to form the connection by the provision of one or more clips. In the context of the present application, the term "clip" may particularly denote a three-dimensionally curved connection element which comprises an electrically conductive material and is an integral body with sections to be connected to the at least one electronic chip and the carrier.

In an embodiment, the at least one contact opening extends up to an electrically conductive portion of the carrier, wherein at least one electrically conductive contact, in particular a solder contact, extends into the at least one contact opening to establish an electrically conductive connection between the at least one component and the electrically conductive portion of the carrier. For instance, the at least one component may comprise at least one electrically conductive contact extending into the at least one contact opening. By taking this measure, it is possible with a simple solder procedure to connect the pre-encapsulated component with the pre-encapsulated electronic chip via one or more contact openings. This is a very simple assembly procedure with a high degree of positional accuracy. This safely prevents an erroneous assembly of the mentioned sub-assemblies of the package.

In an embodiment, the at least one electronic chip is mounted on a finger structure of the carrier (rather than on a planar chip pad). Thus, in the described embodiment, not the entire main surface of the electronic chip is mounted with its full surface on a die pad of the carrier, but in contrast to this electrically conductive fingers only partially support the main surface of the electronic chip and may be guided only up to a respective chip pad or a respective electrically conductive connection element of the chip. By taking this measure, a highly compact configuration is provided which enables also the formation of sophisticated electric coupling paths in a simple way.

In an embodiment, a central mounting portion of the carrier is electrically connected with the at least one electronic chip, and a peripheral mounting portion of the carrier is electrically connected with the at least one component. Such a central (and preferably major) portion of the carrier provides multiple leads which may be used for contacting the one or more electronic chips. One or more remaining leads at a lateral edge may be used for a connection of the one or more components. Thus, a very compact configuration may be provided which nevertheless allows establishing even sophisticated electric coupling architectures.

In an embodiment, the at least one electronic chip and the at least one component are directly mounted (in particular are directly soldered, sintered or glued) on two opposing main surfaces of the same single carrier. In other words, the material of the solder, sinter material and/or glue (in particular an electrically conductive glue) may be the only material between the at least one electronic chip on the one hand and the carrier on the other hand. Correspondingly, the material of the solder, sinter material and/or glue (in particular an electrically conductive glue) may be the only material between the at least one component on the one hand and the carrier on the other hand.

In an embodiment, at least one of the (in particular all) main surfaces of the at least one electronic chip and of the at least one component facing away from each other are fully covered by encapsulant material or may be exposed to an environment. In particular, the mentioned main surfaces may be free from a further carrier. Thus, only a single carrier may be provided for the at least one electronic chip and the at least one component, rendering the manufactured package compact and the manufacturing process simple.

In an embodiment, the carrier comprises at least one local elevation at the at least one contact opening being oriented (for instance being bent) towards the at least one component. Thus, locally raising a respective portion of the carrier to be brought in direct electric contact with a contact of the component allows forming the at least one contact opening or recess with low effort and low depth, thereby simplifying the manufacturing procedure and rendering the electric connection highly reliable. A respective locally elevated portion of the carrier may be manufactured in a simple way by correspondingly bending a respective portion of the carrier.

In an embodiment, the method comprises connecting the at least one electronic chip and the carrier, and/or the at least one component and the carrier, and/or the package and a mounting base, by soldering. As mentioned above, sintering and gluing are alternatives to soldering.

Preferably, the method comprises forming the encapsulant with at least one contact opening (in particular two contact openings), exposing an electrically conductive portion of the carrier, and inserting at least one electrically conductive contact (which may for example extend from the at least one component) into the at least one contact opening to thereby establish an electrically conductive connection between the at least one component and the at least one electronic chip. The mentioned procedure is a very simple process of establishing a reliable electric connection between chips and components via the carrier only.

In an embodiment, forming the encapsulant with at least one contact opening comprises protecting the at least one contact opening from material of the encapsulant during the encapsulating, in particular by film assisted molding. Film assisted molding may implement one or two (for instance Teflon based) films in the mold, which may be sucked down onto its inner surface before material is being loaded. When the carrier with the pre-mounted at least one electronic chip is inserted into an encapsulation tool (such as a molding form) portions of the enclosed volume in which the contact openings are to be formed may be temporarily covered by a dummy material such as a film. The provision of such a dummy material prevents encapsulant material from flowing into the region(s) of the at least one contact opening during the encapsulation process. When the dummy material is removed after the encapsulation, the one or more contact openings have already been formed.

In another embodiment, forming the encapsulant with at least one contact opening comprises removing already formed material of the encapsulant to form the at least one contact opening after the encapsulating, in particular by laser processing. For instance, the encapsulation material may be allowed flowing onto any surface of the carrier with the pre-mounted at least one electronic chip. After completing the encapsulation procedure, a material removal procedure may be carried out for specifically removing material of the encapsulant from the one or more contact openings. This can be accomplished precisely and simply by laser processing. However, encapsulant material may be removed from the position of the one or more contact openings also by a mechanical treatment (for instance by drilling or milling) or by a chemical treatment (for instance by etching).

In an embodiment, the mounting base and the at least one component are located on two opposing sides of the at least one electronic chip. In particular, the mounting base may be located next to the at least one electronic chip and facing away from the at least one component. Therefore, the length of the conduction paths between the at least one encapsulated electronic chip and the mounting base may be kept short.

In an embodiment, at least one lead of the carrier is bent towards the mounting base. Correspondingly, the method may comprise bending at least one lead of the carrier towards the at least one electronic chip, preferably so that ends of the at least one bent lead (in particular its free end or leg) extends at least up to a level of the at least one electronic chip. More particularly, ends of the at least one bent lead may extend deeper than or may extend beyond the at least one electronic chip in a downward direction. This keeps the space consumption small. In other words, the mentioned one or more leads may be bent away from the at least one attached component. This renders the assembly process of the at least one encapsulated component simple.

In particular, the portion of the respective lead extending beyond the encapsulant may be bent in accordance with a gull-wing configuration (compare for instance FIG. 1 and FIG. 5), a C-wing configuration (compare FIG. 10 on the left-hand side), and a J-wing configuration (compare FIG. 10 on the right-hand side). A gull-wing configuration has the advantage of a low vertical height and allows manufacturing a flat package. A C-wing configuration keeps the space requirements small in a lateral direction and provides a springy property allowing equilibration of (for instance thermally-induced) mechanical load or tension. Also a J-wing configuration keeps the space requirements small in a lateral direction.

In an embodiment, the package is configured as a leaded package. A leaded package (see FIG. 1 or FIG. 5 or FIG. 10) comprises leads of the carrier which extend beyond the encapsulant. Preferably, the carrier may comprise at least one lead being bent downwardly away from the component. Furthermore, the at least one bent lead may extend in a downward direction at least up to a lower level of the at least one electronic chip, or even beyond. This configuration is particularly compact and allows for an easy connection of the package with a mounting base such as a PCB.

In another embodiment, the package is configured as a leadless package. A leadless package is for instance shown in FIG. 9. A leadless package comprises substantially no leads extending out of the carrier beyond the encapsulant.

In an embodiment, the one or more electronic chips of a package is a/are power semiconductor chip(s). In particular for power semiconductor chips, electric reliability and mechanical integrity are important issues which can be met with the described manufacturing procedure. Possible integrated circuit elements which can be monolithically integrated in such a semiconductor power chip are field effect transistors (such as insulated gate bipolar transistors or metal oxide semiconductor field effect transistors) diodes, etc. With such constituents, it is possible to provide packages for automotive applications, high-frequency applications, etc. Examples for electric circuits which can be constituted by such and other power semiconductor circuits and packages are half-bridges, full bridges, etc.

As substrate or wafer for the semiconductor chips, a semiconductor substrate, preferably a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology.

The above and other objects, features and advantages of the present invention will become apparent from the following description and the appended claims, taken in conjunction with the accompanying drawings, in which like parts or elements are denoted by like reference numbers.

The illustration in the drawing is schematically and not to scale.

Before exemplary embodiments will be described in more detail referring to the Figures, some general considerations will be summarized based on which exemplary embodiments have been developed.

According to an exemplary embodiment, a chip package may be provided having one or more piggyback (in particular passive) components.

For micro-point-of-load WOO applications, in particular voltage supplies for minor loads, it is typical that at least one electronic chip (in particular one or more semiconductor chips) is placed besides one or more passive components. This however consumes valuable space on a mounting base such as a printed circuit board (PCB). Such an interconnect also limits the performance of the electronic functionality, in particular of a DC/DC converter.

A conventional way is to place the active components (i.e. one or more electronic chips) and passive components (i.e. one or more inductors, capacitors, or resistors) side by side on a main surface of the PCB or on opposite sides of the PCB.

According to an exemplary embodiment, a package architecture is provided in which an encapsulated chip carrier (in particular a molded leadframe) is used for a package and carries one or more piggyback (in particular passive) components (such as an inductor) on top. In such a package, the electronic chip (which may contain a controller, a driver, and one or more integrated circuit elements such as power-FETs for a half bridge) may be plated with pillars (preferably copper pillars). These pillars may be placed and soldered to designated portions (in particular pads) of the carrier (for example a leadframe). After encapsulating (preferably by molding), leads of the carrier may be bent in a way that the electronic chip is oriented towards the mounting base related side (in particular PCB-side) of the carrier. One or more contact openings in the encapsulant (for instance a mold compound) on the side opposing the electronic chip may be provided in a way that a (for instance passive) component such as an inductor can be attached on top of the package. This combination may be routed in a way that it provides the complete functionality of a μPOL.

However, exemplary embodiments of the invention are not limited to μPOL applications. Nevertheless, the embodiments shown in the figures are describing such an application, as the corresponding architecture is highly advantageous in terms of μPOL applications.

Figure 8:
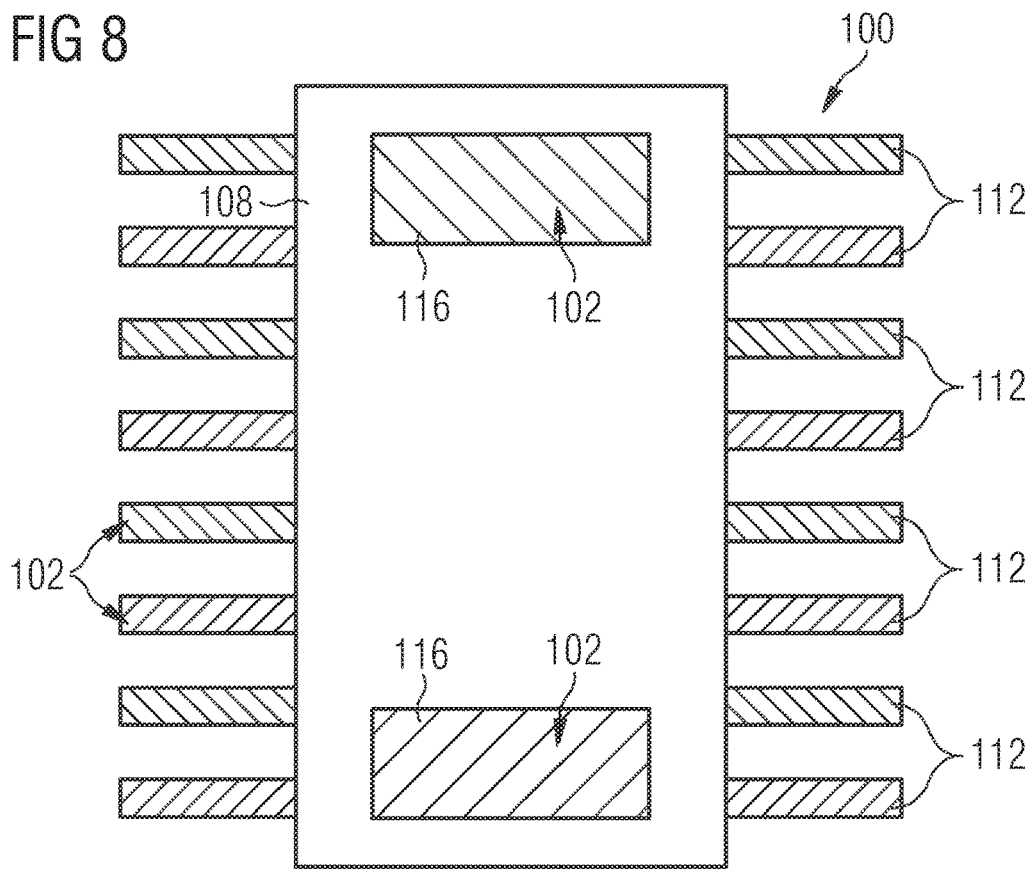
FIG. 8 illustrates a top view of the package according to FIG. 5.

In an embodiment, an electronic chip (preferably with copper pillars) is mounted (in particular soldered) to a carrier such as a leadframe. For instance, this can be flat or contain a down-set. The obtained sub-assembly may be encapsulated (particularly molded) in an asymmetric package. Preferably two areas on the side opposite of the electronic chip may be left open (for example by film assisted molding) or are opened afterwards (for instance with a laser). These two areas may be used afterwards as contact openings to mount a (for instance passive) component (such as an inductor), for instance by soldering or gluing. Leads of the chip carrier may be configured, for example, as shown in FIG. 8.

In another embodiment, an exposed portion of the chip may be provided on the chip backside. This can for instance be a silicon portion or a metallization or a pre-applied heat sink. By connecting this exposed portion to the mounting base (in particular to a PCB), the chip backside can be connected to ground potential or to another defined electric potential.

In yet another embodiment, it is possible to provide at least one other or additional passive component, for instance a capacitor (for example a boot strap capacitor, a ceramic capacitor, etc.) or a resistor (for example for trimming a thermal sensor) or a sensor (like a thermal sensor).

In still another embodiment, pillars at the electronic chip may be omitted and may be replaced by wire bonds. The electronic chip may then be placed on a die pad of the carrier and connected to leads thereof with one or more wire bonds. After encapsulation (in particular molding), the leads may be bent in a way that the chip top side faces the mounting base. Additional areas of the die pad may be formed in a way that they form exposed pads on the package top-side.

Another embodiment provides a leadless package. One of the former constructions may be molded in a way that the leads are not external, but just form pads in the way of a leadless package.

FIG. 1 illustrates a cross-sectional view of an electronic apparatus 130 with a molded leaded package 100 according to an exemplary embodiment.

The electronic apparatus 130 comprises a mounting base 132 which is here configured as printed circuit board (PCB). Alternatively, the mounting base, 132 may be configured as IMS (Insulated Metal Substrate), DCB (Direct Copper Bonding) substrate, DAB (Direct Aluminum Bonding) substrate, etc. On an upper main surface of the mounting base 132, electrically conductive base pads 134 are formed, for instance of copper. The package 100 is mounted on the base pads 134 of the mounting base 132 by a connection structure 136, in particular a solder structure, which mechanically and electrically couples the base pads 134 with leads 112 of the package 100. As can be taken from FIG. 1, the mounting base 132 and a passive component 110 in an interior of the package 100 are located on two opposing sides of an electronic chip 104 and of a carrier 102 (which also includes the leads 112) in the interior of the package 100. The encapsulant-exterior portions of the leads 112 of the leadframe-type chip carrier 102 are bent downwardly in a gullwing shape towards the mounting base 132. End sections of the leads 112 are solder-connected to the base pads 134.

The package 100, which is assembled on the mounting base 132, comprises the leadframe-type carrier 102 which is made of an electrically conductive material such as copper. The electronic chip 104, which is here embodied as a smart power semiconductor (which may comprise a power semiconductor and an integrated circuit (IC) such as a controller, a driver, etc.) configured for a buck converter, is mounted in an electrically conductive way on a lower main surface of the carrier 102. For this purpose, the upper main surface of the electronic chip 104 is equipped with a plurality of electrically conductive connection elements 114 which are here embodied as copper pillars. These connection elements 114 are connected to the lower main surface of the carrier 102, for example by soldering.

The package 100 furthermore comprises a mold-type encapsulant 108 which fully encapsulates the carrier-mounted electronic chip 104. At the same time, the encapsulant 108 encapsulates part of the carrier 102 so that only the leads 112 as end sections of the carrier 102 extend beyond the encapsulant 108. Consequently, the package 100 is configured as a leaded package 100 in which the carrier 102 comprises the multiple leads 112 protruding out of the encapsulant 108 which are bent downwardly away from the passive component 110.

After the encapsulation procedure during which the encapsulant 108 is formed, the above-mentioned passive component 110—which is here embodied as inductor—is attached to an upper main surface of the carrier 102. Before carrying out this attachment procedure, the passive component 110 may be optionally encapsulated (for instance by molding) by a separate further encapsulant 109. Thus, the passive component 110 is partially embedded by separate encapsulant 109. The further encapsulant 109 can thus be a body being different from the encapsulant 108. However, alternatively, it is also possible that the passive component 110 (such as a resistor) is a non-encapsulated (in particular an unmolded) device. Encapsulated or not, the component 110 may be considered as an SMD (surface mounted device) component.

The device composed of the passive component 110 and the further encapsulant 109 can then be attached from an upper direction onto the device composed of the electronic chip 104, the encapsulant 108 and the carrier 102. The connection between these two subassemblies can be formed by a solder structure 122 (such as a solder pad) and can be simplified by providing an opening (such as a contact opening, compare reference numeral 116 in FIG. 3) formed in an upper surface portion of the lower device in combination with a contact (compare reference numeral 118 in FIG. 5) formed in a lower surface portion of the upper device.

By this connection, the passive component 110 is attached via the solder structure 122 to the carrier 102 so as to establish an electrically conductive connection between the electronic chip 104 and the passive component 110 via the carrier 102. This enables an electrical functional cooperation between chip 104 and component 110.

In the shown embodiment, the electronic chip 104 and the passive component 110 are directly mounted by soldering on two opposing main surfaces of the same single carrier 102. Attachment of the passive component 110 on the carrier 102 for establishing an electrically conductive contact between the passive component 110 and the electronic chip 104 is accomplished after individually encapsulating the electronic chip 104 by the encapsulant 108 and the passive component 110 by the separate further encapsulant 109. All main surfaces of the electronic chip 104 and of the passive component 110 facing away from each other are fully covered by material of the encapsulant 108 (in case of the electronic chip 104), and by material of the further separate encapsulant 109 (in case of the passive component 110).

As can be taken from FIG. 1 as well, the package 100 comprises an overall or common encapsulant 179 (such as a mold compound formed by overmolding) encapsulating the first device composed of the carrier 102, the electronic chip 104 and the encapsulant 108, as well as the second device composed of the component 110 and the further encapsulant 109. Thus, the assemblage of the two subassemblies may be made subject of an exterior further encapsulation procedure so as to combine all constituents of package 100 to one single integral body in an interior of the overall encapsulant 179.

FIG. 2 to FIG. 5 illustrate cross-sectional views of structures obtained during manufacturing a package 100, shown in FIG. 5, according to another exemplary embodiment.

Figure 2:
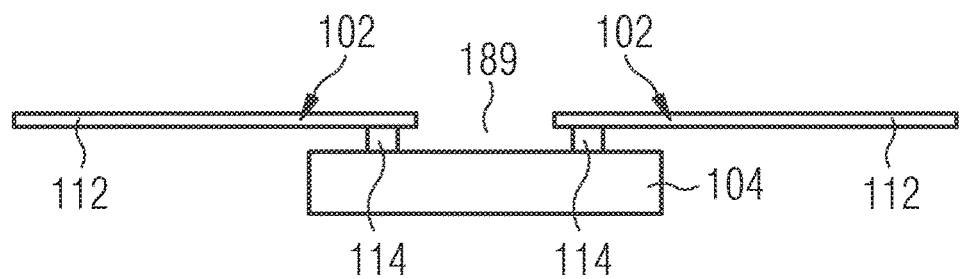
FIG. 2 to FIG. 5 illustrate cross-sectional views of structures obtained during manufacturing a package, shown in FIG. 5, according to an exemplary embodiment.

Referring to FIG. 2, the electronic chip 104 with the connection elements 114 (which may be embodied as copper pillars) on an upper main surface thereof and extending upwardly may be solder-connected with a lower main surface of the leadframe-type carrier 102. Carrier 102 is embodied as a planar structure according to FIG. 2, which may alternatively also be bent or curved. The electronic chip 104, configured as a die with copper pillars, is hence connected to a lower main surface of the leadframe-type carrier 102 having an interruption 189 between adjacent leadframe fingers above a central portion of the electronic chip 104 and between the connection elements 114.

Figure 3:
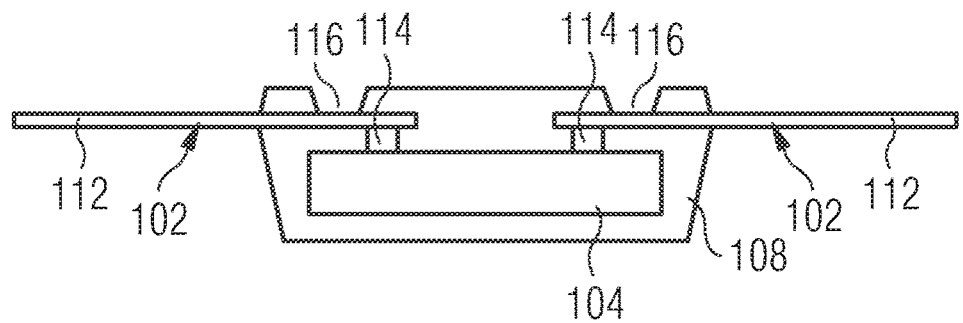

Referring to FIG. 3, a device is shown which is obtained by inserting the structure of FIG. 2 in a mold tool (not shown) and by forming encapsulant 108 by molding. The molding procedure can be carried out in such a way that the encapsulant 108 comprises two contact openings 116 extending into the encapsulant 108 and each exposing a respective electrically conductive surface portion of the carrier 102. In other words, the encapsulant 108 is formed with the two contact openings 116 each exposing, at a respective bottom of the respective opening 116, a respective electrically conductive surface portion of the carrier 102.

For forming the contact openings 116, different options are possible. In one embodiment, forming the encapsulant 108 with the contact opening 116 comprises protecting—for instance with a temporary protection film—the regions of the contact openings 116 from mold material of the encapsulant 108 during the encapsulating procedure. This procedure may also be carried out in accordance with film assisted molding and prevents coverage of the exposed portions of the carrier 102 with material of the mold compound from the very beginning. In another embodiment, it is possible—without the above described protection—to remove material of the encapsulant 108 to form the contact openings 116 after completion of the mold procedure, for instance by laser processing. Treatment with a laser beam selectively in the regions of the contact openings 116 to be formed will remove material of the encapsulant 108 specifically in these regions so that the contact openings 116 can be formed.

Figure 4:
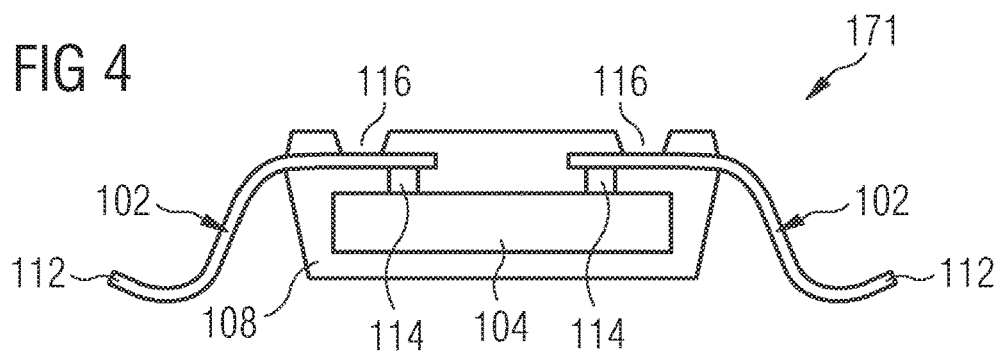

Referring to FIG. 4, the portions of the leads 112 of the carrier 102 protruding beyond the encapsulant 108 are bent towards the mounting base 132 for establishing a gullwing shape. The leads 112 are bent downwardly to extend along and up to or even beyond the electronic chip 104 in a downward direction.

As a result, a device 171 according to an exemplary embodiment is obtained. The device 171 is configured for being electrically and mechanically connected with a further device 173 (shown in FIG. 5) for forming a package 100 according to an exemplary embodiment (shown in FIG. 5 as well). The device 171 comprises the carrier 102, the electronic chip 104 mounted on one side of the carrier 102, and the encapsulant 108 encapsulating the electronic chip 104 and encapsulating part of the carrier 102. Contact openings 116 are configured for electrically connecting a component 110 of the further device 173 to an opposing other side of the carrier 102 by contacts 118 (wherein the latter may form part of the device 171, may form part of the other device 173, or may be formed as pieces being separate from the subassemblies 171, 173).

Referring to FIG. 5, the further device 173 with the pre-encapsulated passive component 110, which has already been partially encapsulated in further encapsulant 109, is attached to the device 171 at the exposed upper main surface of the carrier 102 defined by the contact openings 116. Alternatively, the optional further encapsulant 109 may also be omitted, and the component 110 may be mounted in a non-encapsulated state. The described procedure is carried out after having formed the encapsulant 108, i.e. with the already encapsulated device 171 of carrier 102 and electronic chip 104 and encapsulant 108 with the exposed contact openings 116. By taking this measure, the passive component 110 is attached to the exposed upper main surface portions of the carrier 102 via the contact openings 116 cooperating with solder bodies or contacts 118 of the passive component 110, and may be fixed there, for instance by soldering. Alternatively, the solder bodies 118 may be formed in the contact openings 116 before lowering the passive component 110 towards the electronic chip 104 encapsulated in the encapsulant 108. The contacts 118 and the contact openings 116 are configured to be in mutual alignment so that the connection of the two subassemblies (i.e. carrier 102 with chip 104 and encapsulant 108 on the one hand, and passive component 110 with further encapsulant 109 on the other hand) is simplified. This can be accomplished by inserting the electrically conductive contacts 118 extending downwardly from the passive component 110 into the contact openings 116 formed at an upper main surface of the lower device to thereby establish an electrically conductive connection between the passive component 110 and the electronic chip 104 by soldering. The two opposing main surfaces of the carrier 102 are thereby contacted by the electronic chip 104 and the passive component 110, respectively, and the carrier 102 also forms an electric coupling between the electronic chip 104 and the passive component 110.

Figure 6:
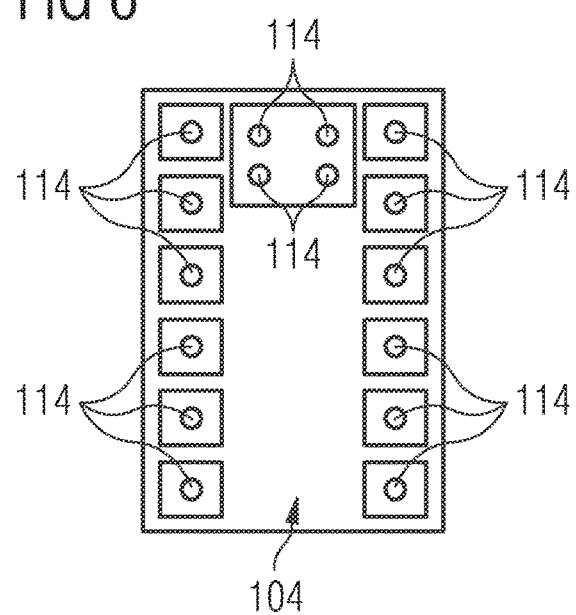
FIG. 6 illustrates a top view of an electronic chip with pillar-type connection elements of the package according to FIG. 5.
Figure 7:
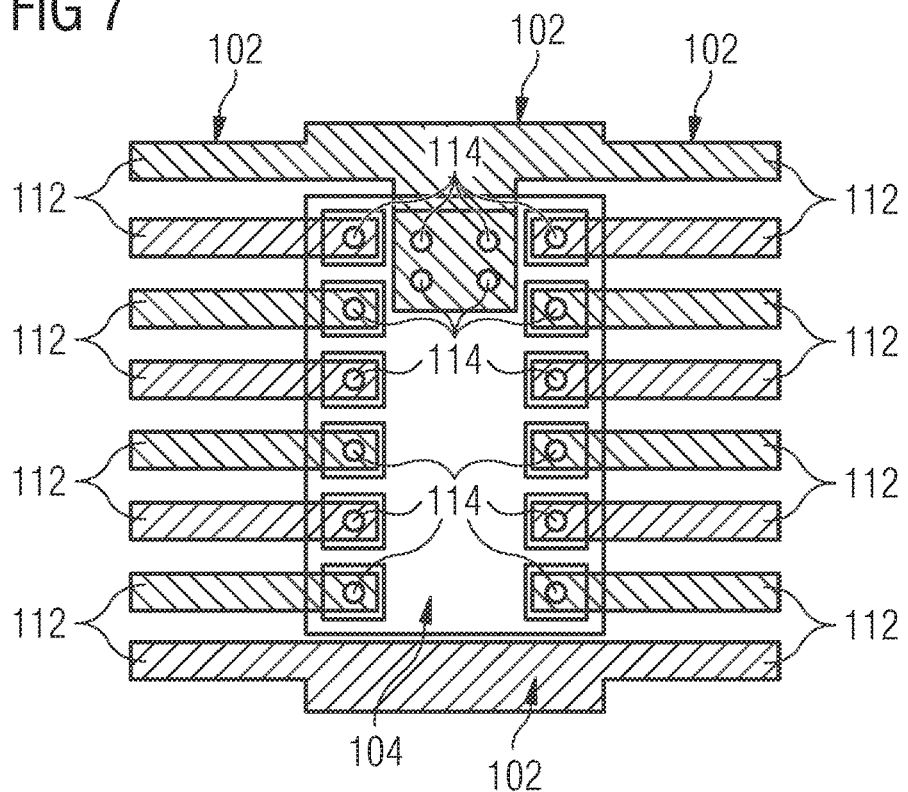
FIG. 7 illustrates a top view according to the cross-sectional view of FIG. 2 illustrating the electronic chip of FIG. 6 connected to a carrier.

FIG. 6 illustrates a top view of the electronic chip 104 with pillar-type connection elements 114 of the package 100 according to FIG. 5. FIG. 7 illustrates a top view according to the cross-sectional view of FIG. 2 illustrating the electronic chip 104 of FIG. 6 connected to the leadframe type carrier 102. FIG. 8 illustrates a top view of the package 100 of FIG. 5.

As can be taken from FIG. 8, the contact openings 116 expose a respective rectangular area of the carrier 102. In the embodiment of FIG. 8, the leadframe-type carrier 102 comprises fourteen (any other number is possible) leads 112 which extend out of two opposing sides of the encapsulant 108 and extend in parallel to one another in the view of FIG. 8. A skilled person will understand that, as an alternative to the configuration shown in FIG. 8, many other lead configurations are possible. Leads 112 may extend out of only one side of the encapsulant 108, out of two (for instance opposing, as shown in FIG. 8) sides, from three sides or from all four sides.

FIG. 9 illustrates a cross-sectional view of a leadless package 100 according to another exemplary embodiment.

Compared to the embodiments described above, no leads 112 of carrier 102 extend beyond encapsulant 108 according to FIG. 9. Lower lateral surfaces of the carrier 102 are exposed at the bottom of the package 100 for electric contact purposes, to thereby establish a leadless configuration.

As a further difference to the embodiments of the package 100 described above, the embodiment of FIG. 9 comprises bond wires 120 (rather than connection elements 114 extending from the electronic chip 104) electrically connecting pads 186 of the electronic chip 104 with the carrier 102.

As yet another difference to the embodiments of the package 100 described above, the embodiment of FIG. 9 has a contact opening 116 defined by an exposed curved portion of the carrier 102 (see reference numeral 183 on the left-hand side of FIG. 9). In such an embodiment, the carrier 102 may also slightly protrude beyond the encapsulant 108. Beyond this, the embodiment of FIG. 9 has a further contact opening 116 defined by a plated structure 181. For example, the plated structure 181 may be completely inside an opening formed in the surface of the encapsulant 108 or may protrude in a mushroom like fashion (not shown). The latter described embodiment may be manufactured by plating tin sufficiently thick on all surfaces. As shown, electrically conductive material may be deposited by plating so that the contact opening 116 is lined with an electrically conductive layer, thereby further simplifying and promoting a reliable electric connection with the corresponding contact 118. In a preferred embodiment, the plated contact 118 may be embodied as a plated solder material such as tin. A purpose could be to provide a solder reservoir and to level the opening 116 for a simpler soldering process. This would not be visible after the soldering of the component 110, but only in the subassembly.

FIG. 10 illustrates a cross-sectional view of a leaded package 100 according to still another exemplary embodiment.

The embodiment of FIG. 10 is similar to the embodiment of FIG. 5. However, no further encapsulant 109 is provided according to FIG. 10. The component 110 is laterally contacted by lateral solder structures 185 according to FIG. 10 and may thus be configured for instance as SMD component (in particular as SMD resistor). In the following, further main differences between the two embodiments of FIG. 10 and FIG. 5 will be described.

The embodiment of FIG. 10 is configured as a leaded package 100 with leads 112 being bent downwardly in a direction away from the component 110. More precisely, the leads 112 are bent in a downward direction so far and to such an extent that they extend downwardly up to or beyond the electronic chip 104. The lead 112 on the left-hand side of FIG. 10 is formed with C-wing configuration, whereas the lead 112 on the right-hand side of FIG. 10 is designed in a J-wing configuration. Both these configurations provide a high compactness in lateral direction. In particular the C-wing configuration has additionally pronounced resilient properties which protects the package 100 from damage due to (for instance thermally-induced) mechanical load.

As can be taken from FIG. 10 as well, a lower main surface of the electronic chip 104 is exposed with regard to the encapsulant 108. Moreover, a heat sink 197—which is here embodied as a metal plate such as a copper plate with high thermal conductivity—is attached to the exposed lower main surface of the electronic chip 104. By such a heat sink 197, thermal energy which is generated during operation of the package 100, in particular from the electronic chip 104 (which may be a power semiconductor chip) can be efficiently removed or dissipated from the package 100 by the heat sink 197.

Also the component 110 is exposed, on its upper main surface, with regard to the environment of the package 100. This is in particular advantageous when the component 110 has a function which requires an exposed surface. For instance, the exposed component 110 may be a light-emitting diode emitting light via the exposed upper main surface, may be a laser diode, etc.

As can be taken from FIG. 10 as well, the carrier 102 comprises two local elevations 198 at the two contact openings 116. These two local elevations 198 are oriented towards the component 110 (with a corresponding indentation oriented towards the chip 104) and therefore render it possible that the depth of the contact openings 116 is reduced to zero. This simplifies the manufacture of the contact openings 116.

Moreover, the connection elements 114 connecting the electronic chip 104 with the carrier 102 are embodied as solder bumps according to FIG. 10.

Furthermore, a further passive component 184 is mounted by further connection elements 114 on another portion of the lower main surface of the carrier 102 and is encapsulated by the encapsulant 108 as well. Thereby, the available space can be efficiently used for further refining the electric functionality of the package 100. Additionally or alternatively to the provision of the further passive component 184 as shown in FIG. 10, it is also possible that one or more further active components and/or one or more further passive components is or are mounted on any of the main surfaces of the carrier 102 and/or at the outside surface of the package 100.

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A package, comprising:
   a carrier;
   at least one electronic chip mounted on one side of the carrier;
   an encapsulant at least partially encapsulating the at least one electronic chip and partially encapsulating the carrier;
   at least one component attached to an opposing other side of the carrier via at least two contact openings;
   wherein each of the contact openings is laterally surrounded by encapsulant material and extends up to an electrically conductive portion of the carrier; and
   wherein at least one electrically conductive contact extends into each of the contact openings to establish an electrically conductive connection between the component and the electrically conductive portion of the carrier.

2. The package according to claim 1, wherein the carrier is a metallic carrier.

3. The package according to claim 1, wherein the at least one component comprises at least one of the group consisting of a passive component and an active component.

4. The package according to claim 1, configured as a leaded package, in particular as a leaded package.

5. The package according to claim 1, wherein the at least one component is at least partially encapsulated by a separate encapsulant.

6. The package according to claim 1, wherein the at least one electronic chip comprises at least one electrically conductive connection element connected to the carrier.

7. The package according to claim 6, wherein the at least one electrically conductive connection element comprises at least one of a group consisting of at least one pillar, at least one bump, and at least one solder ball.

8. The package according to claim 1, wherein at least one main surface of the at least one electronic chip is exposed with regard to the encapsulant.

9. The package according to claim 1, wherein the at least one electronic chip is mounted on a finger structure of the carrier.

10. The package according to claim 1, wherein the at least one electronic chip and the at least one component are directly mounted on two opposing main surfaces of the same single carrier.

11. The package according to claim 1, wherein the carrier comprises at least one local elevation at least one of the at least two contact openings being oriented towards the at least one component.

12. The package according to claim 1, comprising common encapsulant at least partially encapsulating the carrier, the at least one electronic chip, the encapsulant and the at least one component.

13. The package according to claim 1, wherein at least one of the at least two contact openings is formed as at least one of the group consisting of:
   at least one contact opening in the encapsulant;
   at least one contact opening defined by a curved portion of the carrier; and
   at least one contact opening defined by a plated structure.

14. An electronic apparatus, comprising:
   a mounting base; and
   a package according to claim 1 mounted on the mounting base.

15. The electronic apparatus according to claim 14, wherein the mounting base and the at least one component are located on two opposing sides of the at least one electronic chip.

16. The electronic apparatus according to claim 14, wherein at least one lead of the carrier is bent towards the mounting base.

17. A method of manufacturing the package of claim 1, the method comprising:
   mounting at least one electronic chip on one side of a carrier; at least partially encapsulating the at least one electronic chip and partially encapsulating the carrier by an encapsulant;
   forming the encapsulant with at least two contact openings exposing an electrically conductive portion of the carrier, wherein each of the contact openings is laterally surrounded by encapsulant material;
   attaching at least one component to an opposing other side of the carrier through the at least two contact openings; and
   inserting at least one electrically conductive contact into each of the contact openings to thereby establish an electrically conductive connection between the component and the at least one electronic chip.

18. The method according to claim 17, wherein the method comprises connecting at least one pair of the group consisting of the at least one electronic chip and the carrier, the at least one component and the carrier, and the package and a mounting base, by soldering.

19. The method according to claim 17, wherein forming the encapsulant with at least two contact openings comprises one of the following features:
   protecting the at least two contact openings from material of the encapsulant during the encapsulating; or
   removing material of the formed encapsulant to form the at least two contact openings after the encapsulating.

20. The method according to claim 17, wherein the method comprises bending at least one lead of the carrier towards the at least one electronic chip in a downward direction.

21. A method of using the package according to claim 1 for a DC-DC converter.

22. A device for connection with a further device for forming a package, the device comprising:
   a carrier;
   at least one electronic chip mounted on one side of the carrier;
   an encapsulant at least partially encapsulating the at least one electronic chip and partially encapsulating the carrier; and
   at least two contact openings configured for attaching and electrically connecting at least one component of the further device to an opposing other side of the carrier, wherein each of the contact openings is laterally surrounded by encapsulant material.

* * * * *